United States Patent
Sinz

(10) Patent No.: US 12,407,333 B1
(45) Date of Patent: Sep. 2, 2025

(54) METHOD OF PARASITIC OSCILLATION REDUCTION AND PARASITIC OSCILLATION IMMUNE RESONANT CONVERTER

(71) Applicant: Derek Sinz, Hillsboro, OR (US)

(72) Inventor: Derek Sinz, Hillsboro, OR (US)

(73) Assignee: KNOWLEDGEABLE HOLDINGS LLC, Sheridan, WY (US)

(\*) Notice: Subject to any disclaimer, the term of this patent is extended or adjusted under 35 U.S.C. 154(b) by 248 days.

(21) Appl. No.: 18/469,371

(22) Filed: Sep. 18, 2023

Related U.S. Application Data

(60) Provisional application No. 63/376,266, filed on Sep. 19, 2022.

(51) Int. Cl.
| | | |
|---|---|---|
| *H03K 3/013* | (2006.01) | |
| *H03B 5/12* | (2006.01) | |
| *H03B 5/18* | (2006.01) | |
| *H03K 17/16* | (2006.01) | |

(52) U.S. Cl.
CPC ........... *H03K 3/013* (2013.01); *H03B 5/1215* (2013.01); *H03B 5/1852* (2013.01); *H03K 17/16* (2013.01)

(58) Field of Classification Search
CPC ...... H03K 3/013; H03K 17/16; H03B 5/1215; H03B 5/1852
See application file for complete search history.

(56) References Cited

U.S. PATENT DOCUMENTS

| | | |
|---|---|---|
| 2,783,384 A | 2/1957 | Royer et al. |
| 2,915,710 A | 12/1959 | Schiewe et al. |
| 2,950,446 A | 8/1960 | Humez et al. |
| 6,124,581 A | 9/2000 | Ulrich |
| 6,215,367 B1 * | 4/2001 | Blaud ................. H03B 5/1215 331/177 V |
| 8,816,725 B2 * | 8/2014 | Steeneken ........... H03K 17/102 327/108 |
| 10,903,790 B1 * | 1/2021 | Jin ......................... H03L 1/027 |
| 2017/0264140 A1 | 9/2017 | Abdolkhani et al. |
| 2019/0058389 A1 | 2/2019 | Telefus et al. |
| 2019/0074776 A1 | 3/2019 | Tian |

FOREIGN PATENT DOCUMENTS

GB 959550 A 6/1964

\* cited by examiner

Primary Examiner — Jeffrey M Shin

(57) ABSTRACT

A method is disclosed for preventing a driver from changing the state of an output switch in response to parasitic oscillation that includes allowing or preventing a signal from the driver from reaching the output switch based on a timing signal. Also disclosed is a way to prevent a driver from changing the state of an output switch in response to parasitic oscillation by using a directional element, a timing element, and a control element. An exemplary oscillator circuit that uses a diode, a MOSFET, and a resistor to prevent parasitic oscillation without adding propagation delay, and a block diagram of circuit functionality, is also disclosed.

19 Claims, 7 Drawing Sheets

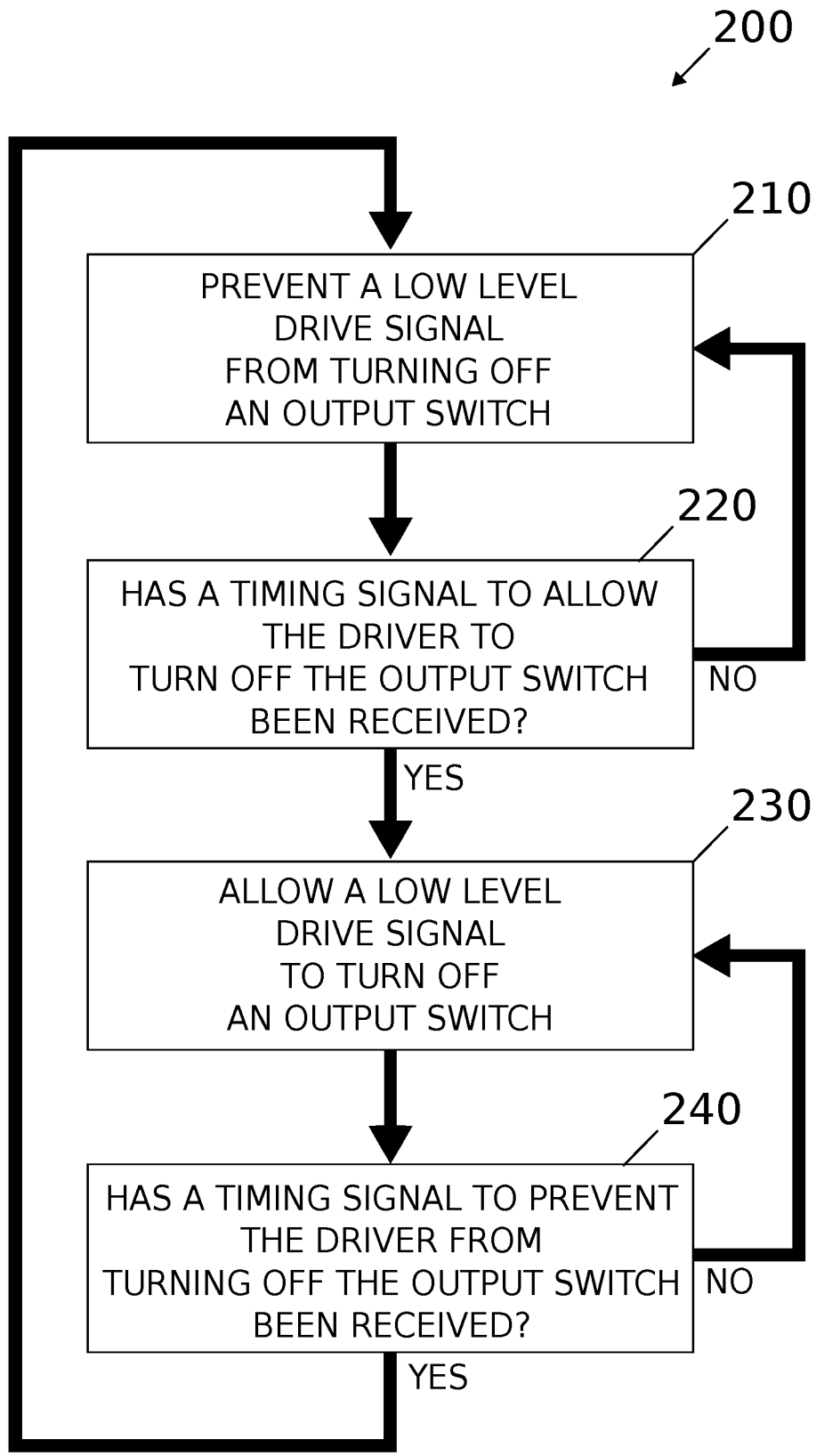

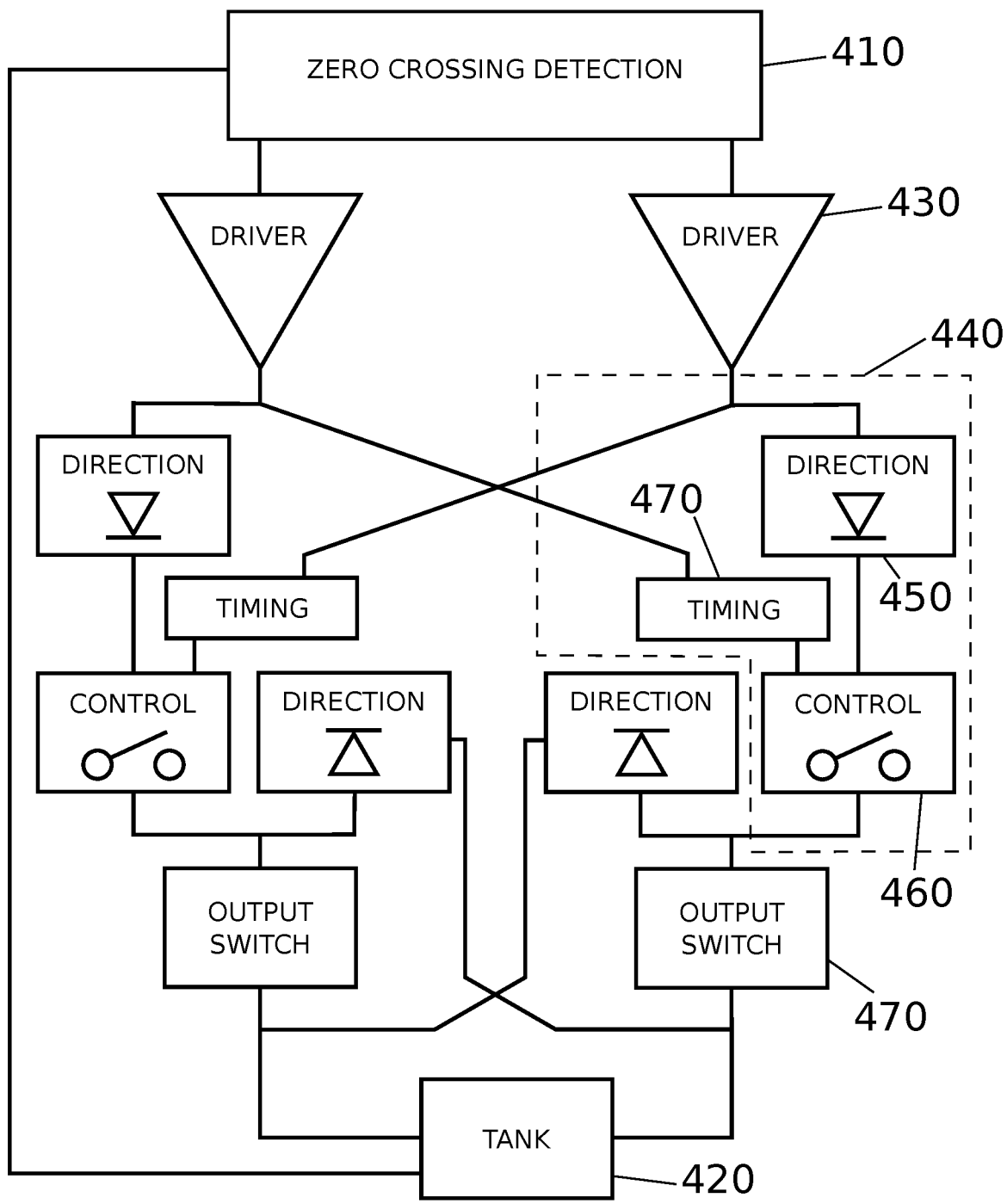

METHOD OF PARASITIC OSCILLATION REDUCTION AND PARASITIC OSCILLATION IMMUNE RESONANT CONVERTER

CROSS-REFERENCE TO RELATED APPLICATIONS

This application claims the benefit of U.S. Provisional Patent Application No. 63/376,266 entitled "Self-Centering Cartridge Case Annealer with Data Analysis" filed on Sep. 19, 2022 by Derek Sinz and is incorporated herein by reference.

REFERENCE TO RELATED PATENTS
U.S. Patents

| Pat. No. | Kind Code | Publ. Date | Patentee |
|---|---|---|---|
| 2,783,384 | A | 1957 Feb. 26 | Royer, George H et al. |
| 2,915,710 | A | 1959 Dec. 01 | Schiewe, Arthur J et al. |
| 2,950,446 | A | 1960 Aug. 23 | Humez, David E et al. |
| 6,124,581 | A | 2000 Sep. 26 | Ulrich, Mark |

Foreign Patent Documents

| Patent Number | Cntry Code | Kind Code | Date | Name |
|---|---|---|---|---|
| 959550 | GB | A | 1964 Jun. 03 | Baxandall, Peter James |

REFERENCE TO RELATED APPLICATIONS
U.S Patent Application Publications

| Pat. applicaiton No. | Kind Code | Publ. Date | Patentee |
|---|---|---|---|
| 20170264140 | A1 | 2017 Sep. 14 | Abdolkhani, Ali et al. |
| 20190058389 | A1 | 2019 Feb. 21 | Telefus, Mark et al. |
| 20190074776 | A1 | 2019 Mar. 07 | Tian, Jianlong |
| 20220052608 | A1 | 2022 Feb. 17 | Yukawa, Fumio et al. |

NON-PATENT CITATIONS

Title: "Royer Induction Heater", Print Date: 2011 Aug. 13, Site Name: 4HV.org, URL: https://4hv.org/e107_plugins/forum/forum_viewtopic.php?122354 Title: "Royer oscillator induction heater", Print Date: 2011 Aug. 2, Site Name: YouTube.com, URL: https://www.youtube.com/watch?v=0019qDIfOm0

BACKGROUND OF THE INVENTION

Resonant oscillators generate an alternating current by driving a resonant element at its resonant frequency. The resonant element, commonly known as a tank circuit, contains an inductor and a capacitor. The capacitance stores power as electric charge. The inductor stores power as flux. Power stored in the inductor passes to the capacitor and then returns to the inductor at a resonant frequency. The same phenomenon can be seen in a swingset where kinetic energy turns to potential energy and back at a resonant frequency.

Resonant oscillators use electrical components to switch power to the tank circuit at its resonant frequency. In this disclosure the electrical components that apply power to the tank circuit are referred to as output switches to distinguish them from other electrical components that perform a switching function. MOSFETS and IGBTs are commonly used as output switches.

In a resonant oscillator it is desirable to change the state of the output switches between ON and OFF states as quickly as possible because when an output switch is neither ON nor OFF it dissipates large amounts of power. It is also desirable to change the state of output switches when either the voltage across the tank is zero or the current to the tank is zero. This is a consequence of physics. Since power equals voltage times amperage, wasted power can be drastically reduced if amperage or voltage are as close to zero as possible during switching.

A resonant oscillator which changes the state of output switches when tank voltage is near zero is called a zero voltage switching (ZVS) oscillator. All ZVS oscillators contain circuitry for detecting when the tank voltage is near zero but there are many different ways to accomplish this. For example, some circuits detect when the tank voltage changes polarity while others detect when the tank voltage crosses a threshold level. For simplicity and readability this disclosure refers to any circuitry that generates a signal which causes the output switches to change state as zero crossing detection (ZCD) circuitry.

Output switches are typically controlled by a voltage at their "gate terminal" (gate), and the gate has an associated capacitance which takes time to charge and discharge. In a ZVS, signals from the ZCD are almost always amplified before reaching the output switches because the time required to change the state of an output switch depends on the magnitude of current that flows through the gate. The component that amplifies the signal from the ZCD is called a driver.

The faster a driver can change the state of an output switch, the lower the amount of power it dissipates. However, there is a problem known as parasitic oscillation which makes driving a switch as quickly as possible problematic. In addition to their intended operating frequency, tank circuits and their associated circuitry can also oscillate at unintended frequencies. This is due to unintentional, or parasitic, capacitance and inductance in the components and wires. When an output switch changes state, the tank circuit will briefly undergo a parasitic oscillation. These oscillations can cause increased electromagnetic interference (EMI) and affect the operation of nearby devices. In some cases the circuit can drive the tank at a parasitic frequency rather than the resonant frequency. This can cause component or device failure.

FIELD OF THE INVENTION

The present disclosure relates to the design of oscillators, more specifically resonant oscillators.

DESCRIPTION OF THE PRIOR ART

In the 1957 patent U.S. Pat. No. 2,783,384A George Royer disclosed a simple oscillator which could be used to generate a square wave. The Royer oscillator was modified by James Baxandall in the 1964 patent GB959550-A to output sine waves. These circuits form the basis of many modern resonant converters.

Around 2002, Vladimiro Mazzilli created an oscillator based on the Royer oscillator. Unlike the Royer and Baxandall converters, Mazzilli's oscillator did not require an auxiliary coil to be wound around the magnetic core of the tank circuit but instead used diodes. This simplification made the oscillator design popular.

The signal from the ZCD was not amplified by a driver in the original Mazzilli oscillator. There have been several attempts to create a circuit that retained the simplicity of the Mazzilli oscillator while using drivers to amplify the signals from the ZCD. However, simply increasing the gain by adding drivers will allow the amplification of parasitic oscillations as well as the fundamental frequency.

Oscillator designs may place low pass filters, hysteresis, logic gates, pulse steering, and/or other circuitry within the ZCD or between the ZCD and the drivers to prevent the amplification of parasitic oscillation. However, this results in a delay which makes the output switches change state later than the zero crossing. This in turn wastes power and increases the power dissipation requirements of the output switches.

SUMMARY

It should be evident from the aforementioned discussion that there is a need for a method, means, and simple circuit which eliminates the possibility of parasitic oscillation without adding propagation delay to the changing of output switch states. This would enable fast output switching without the risk of increased EMI or component failure, and could be applied to simple or complex oscillator designs.

One embodiment relates to a method for preventing parasitic oscillation by controlling signals between a driver and output switch. In an embodiment a signal emitted from a driver is only allowed to change the state of a output switch in a predetermined direction, either from OFF to ON or from ON to OFF, at a predetermined time.

Another embodiment relates to a means for preventing parasitic oscillation by controlling signals between a driver and output switch. An embodiment employs a timing means to generate a timing signal in anticipation of when a zero crossing should occur. The timing signal is used in conjunction with a control means and a directional means so that when the anticipated zero crossing does occur, the output switch is only allowed to change to the expected state and is not allowed to change back to its previous state, preventing unexpected oscillation.

Another embodiment relates to an oscillator circuit that uses fast output switching without suffering from parasitic oscillation or propagation delay.

Advantages of one or more aspects of the present disclosure will become more fully apparent from the following description and appended claims.

BRIEF DESCRIPTION OF DRAWINGS

FIG. 2 shows an exemplary embodiment of a method for preventing parasitic oscillations emitted from a driver from reaching an output switch gate.

FIG. 4A shows an exemplary block diagram of a circuit which prevents parasitic oscillations emitted from a driver from reaching an output switch gate.

DETAILED DESCRIPTION OF THE INVENTION

Description of an Embodiment of a Method—FIGS. 1 and 2

Figure 1A:
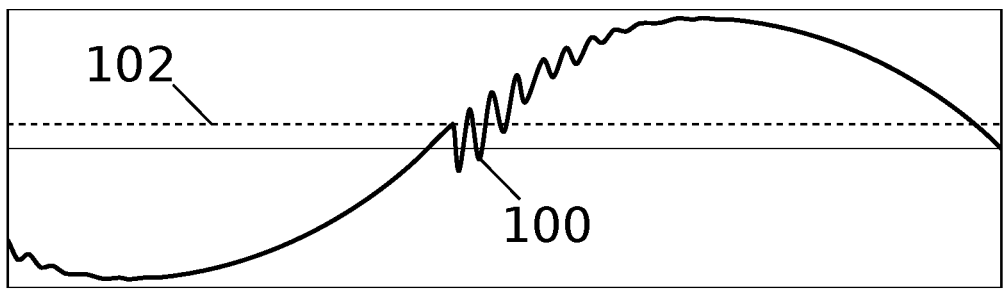
FIG. 1A shows an exemplary tank voltage waveform experiencing parasitic oscillation.
Figure 1B:
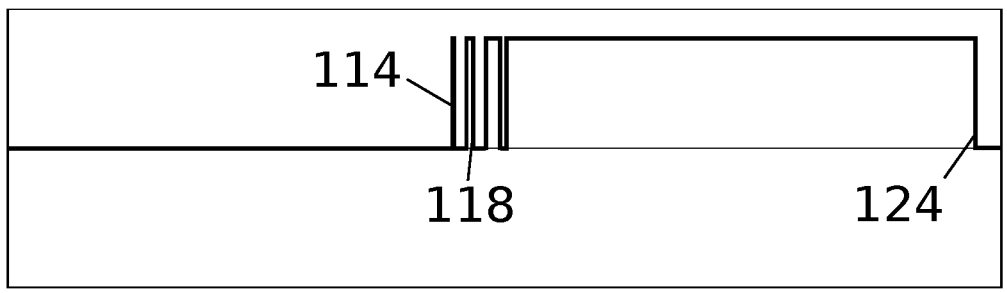
FIG. 1B shows an exemplary effect of parasitic oscillation on a ZCD circuit that outputs a voltage signal.

FIG. 1A shows an example of a tank voltage during the operation of an oscillator. In this embodiment when an output switch changes state, there is a parasitic oscillation 100 overlaid with the fundamental resonant frequency. In this embodiment the ZCD has a voltage threshold level 102 which is slightly higher than zero. Every time the tank voltage crosses the voltage threshold level 102, the signal from the ZCD changes as shown in FIG. 1B. If the signals of FIG. 1B were connected directly to the output switch gate, power would be applied to the tank circuit near the frequency of the parasitic oscillation, causing the previously mentioned malfunctions.

An embodiment of a method for preventing the amplification of parasitic oscillations 200 is shown in FIG. 2. In the first step of a method 200, prevent turn OFF 210, a low level drive signal from a specific driver may not be allowed to turn off its associated output switch. This may not be allowed until a first timing signal is received 220. Upon receipt of a first timing signal a method may be allowed to progress to the third step allow turn off 230. Finally when a second timing signal is received 240 the method may restart for the next cycle of oscillation.

Figure 1C:
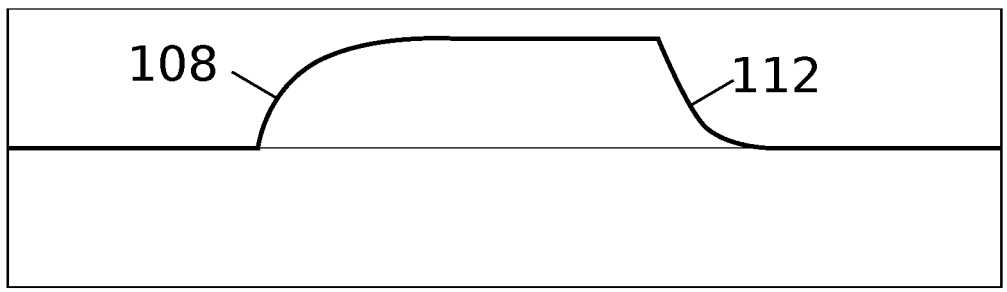
FIG. 1C shows an example of a timing signal used to determine whether a ZCD voltage signal is the result of parasitic oscillation.
Figure 1D:
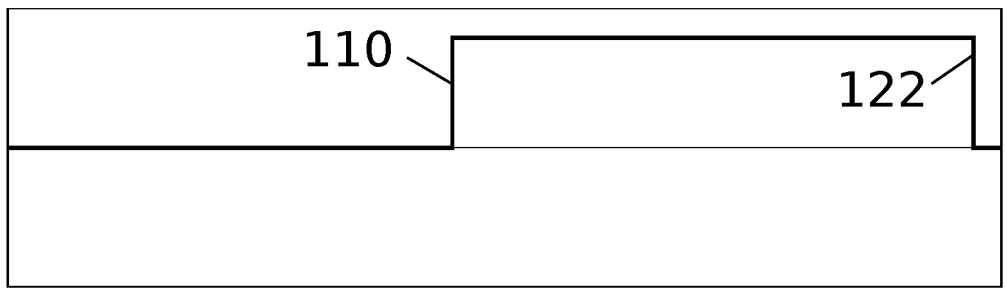
FIG. 1D shows an example of a voltage at an output switch gate that has ignored parasitic oscillations.

An exemplary graph of a timing signal, according to the embodiment of a method described in FIG. 2, is illustrated in FIG. 1C. In this example, the first timing signal 108 is the positive edge of a voltage level and the second timing signal 112 is the negative edge of a voltage level. In this example, after the first timing signal 108 a signal from a driver is prevented from turning OFF the output switch. An exemplary graph of the corresponding gate voltage of an output switch is shown in FIG. 1D. After the first positive edge of a drive signal 114 the output switch gate voltage goes high 110, and a negative edge from parasitic oscillation 118 will not lower the output switch gate voltage because it is prevented. After second timing signal 112, a negative edge from the fundamental oscillation frequency 124 may be allowed to turn the output switch OFF 122.

In the foregoing description of an embodiment of a method, the voltage levels were used to generate signals, and the edges of the voltage levels denoted first and second signals. This is not the case in every embodiment but only an exemplary case, other embodiments may use logic levels represented by currents or other signaling means. One aspect of the exemplary timing signal shown in FIG. 1C is that the waveform which creates the timing signals 108, 112 changes relatively slowly while the driver output voltage changes quickly. This is to illustrate that the circuitry used for timing signals may be slow and delayed without causing any delay or slowness at the gate of the output switch.

It will also become apparent that the ability of an exemplary method to prevent the amplification of parasitic oscillation does not necessarily require that the method be applied to every signal. In some embodiments and implementations, simply applying this method of parasitic oscillation on a single signal may be sufficient to prevent parasitic oscillations from being problematically amplified.

Description of One Embodiment of a Means-FIG. 3

Figure 3A:
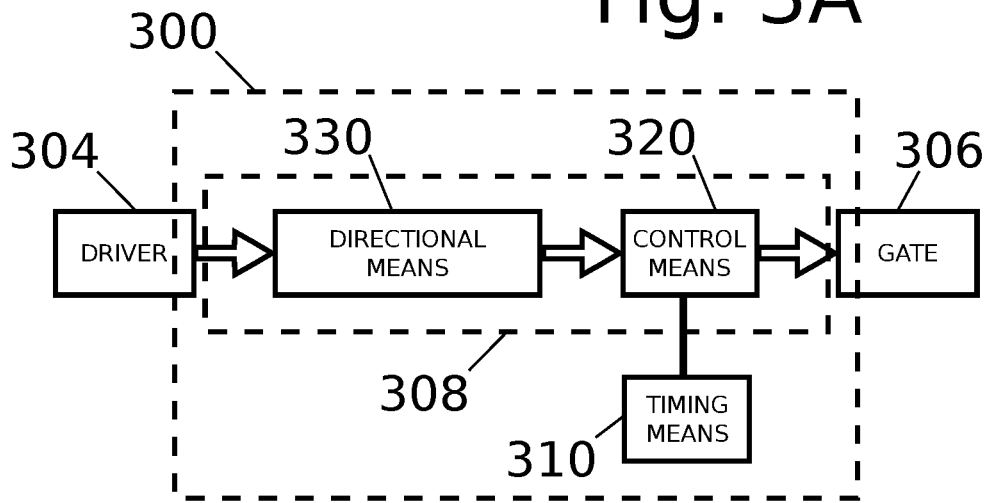
FIGS. 3A, 3B, and 3C show exemplary embodiments of a means for preventing parasitic oscillations emitted from a driver from reaching an output switch gate.

The signal conveying means 300 of FIG. 3A performs a similar function to the embodiment of a method 200 described in FIG. 2. The timing signals which determine whether a signal from a driver are allowed to reach a gate may be generated by a timing means 310. A directional means 330 may determine or differentiate between a signal to change the state of the output switch from OFF to ON and a signal to change the state of the output switch from ON to OFF. The directional means 330 may thereby prevent one or more types of signal from being conveyed along a signal path 308 between a driver 304 and a gate 306 of an output switch. A control means 320 may determine whether a signal being conveyed along a signal path 308 is able to reach the gate based on signals from the timing means 310.

Figure 3B:
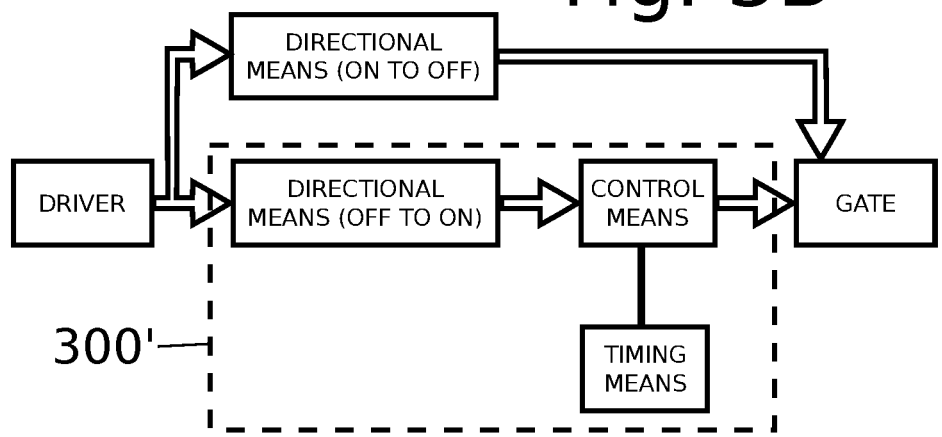
Figure 3C:
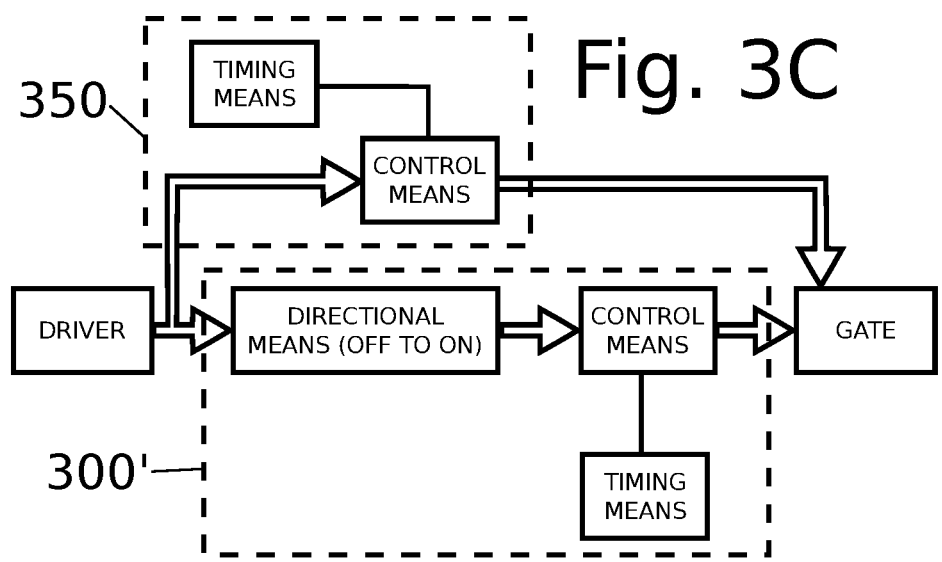

As shown in FIG. 3B, one signal conveying means 300' may be used to convey signals in the direction from OFF to ON, and an alternate signal path may convey signals for state changes in the direction from ON to OFF. In the embodiment of FIG. 3C, a signal conveying means 300' may be entirely overridden by an alternate signal conveying means 350 which conveys signals in both directions. Aspects of this embodiment may be useful in applications where parasitic oscillations are only problematic during a particular time such as oscillator startup, and the available power is limited, such as in battery powered devices.

The timing means of FIGS. 3A, 3B, and 3C may generate signals based on any suitable method. In one embodiment, a timing means may generate a signal in response to a periodic event such as a tank voltage reaching or exceeding a threshold level or changing polarity. Other signals from other events may also be used by the timing means. Microprocessors may generate signals for use by the timing means, as may RC delay circuits such as multivibrators, as may a phase locked loop, as may other circuits.

Figure 4B:
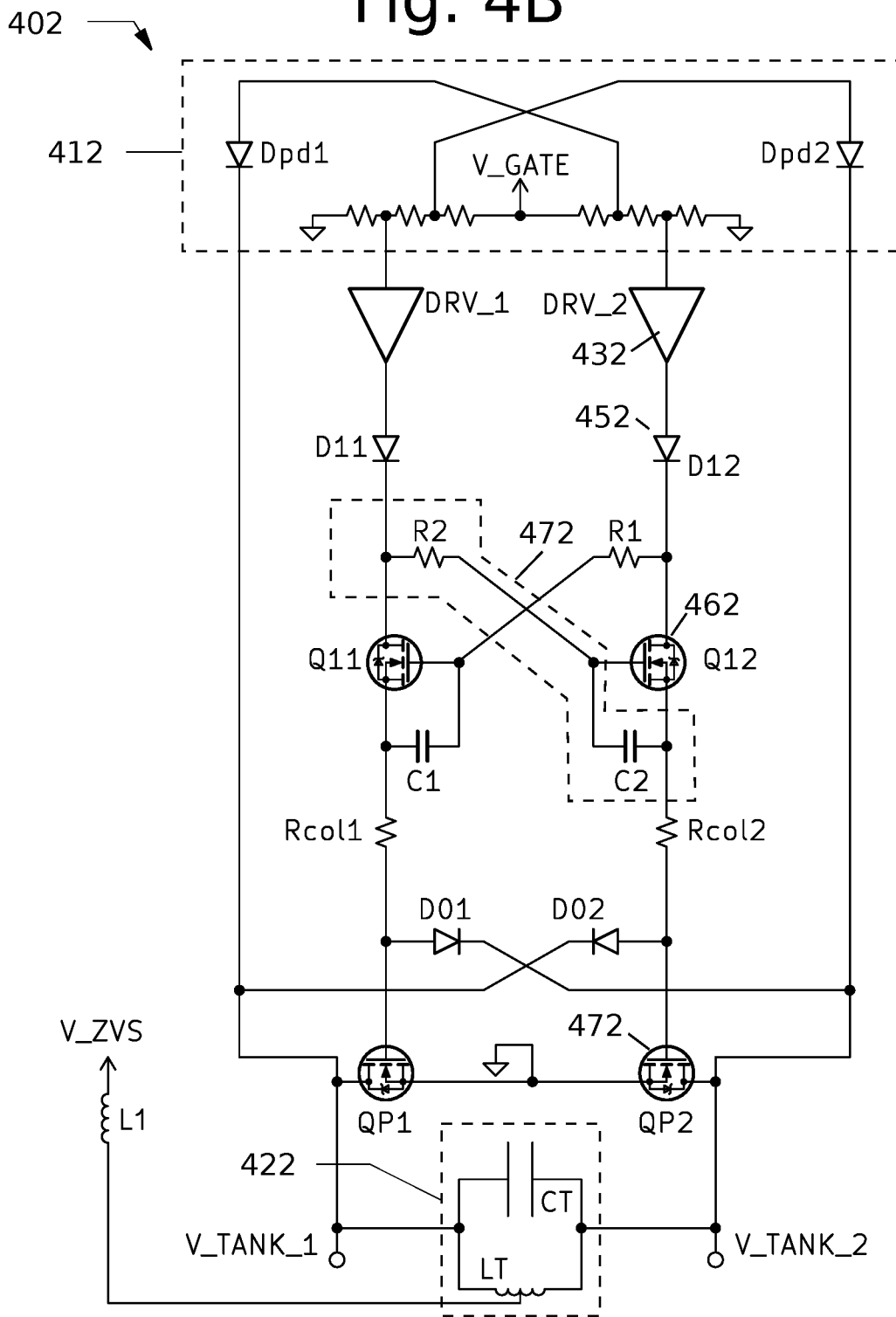
FIG. 4B is an exemplary embodiment of a circuit which is not affected by parasitic oscillations.

Block Diagram and Implementation of an embodiment of an Oscillator Circuit—FIGS. 4A and 4B An embodiment of a oscillator circuit is represented by the block diagram 400 of FIG. 4A. In this embodiment, a zero crossing detection circuit 410 monitors a tank circuit 420. A signal by the ZCD is sent to a driver 430. The amplified signal then enters a signal conveyance means 440 including a directional element 450, a control element 460, and a timing element 470. The signal conveyance means 440 conveys signals to the gate of the output switch 470. The operation of this embodiment of a block diagram is one possible implementation of the means embodied in FIG. 3B.

A schematic of an embodiment of an oscillator circuit 402 is shown in FIG. 4B. This embodiment is one possible implementation of the block diagram of FIG. 4A. In this embodiment, a ZCD circuit 412 monitors the voltage of a tank circuit 422. Again, for the purposes of this disclosure ZCD refers to any circuit that generates a signal when the tank voltage or current is at or near zero. In this embodiment the ZCD detects when a tank voltage is above a threshold level. A voltage signal by the ZCD is sent to a driver 432. The directional element 452 consists of diode D12. The control element 462 consists of MOSFET Q12. The timing element 472 is made from resistor R2 and capacitance C2. Capacitance C2 may come from a discrete component or from the gate capacitance of Q12. The signal path is composed of D12, Q12, and Rcol2.

Operation of an Embodiment of an Oscillator circuit—FIG. 4B

When the circuit of FIG. 4B is first powered neither QP1 nor QP2 are active. The voltage of both V_TANK_1 and V_TANK_2 rise, bringing the outputs of DRV_1 and DRV_2 high. This charges C1 through R1 and C2 through R2, raising the voltage on the gates of Q11 and Q22.

As the gate voltages of Q11 and Q12 rise either QP1 or QP2 will turn on first and clamp the voltage signal of the opposite driver, in this example QP2 does so. This will cause the output of DRV_1 to go low, preventing QP1 from clamping. Meanwhile C1 charges through R1, activating Q11 so that once DRV_1 goes high QP1 will clamp V_TANK_1 to ground.

While the active power switch QP2 is clamping V_TANK_2 to ground, V_TANK_1 increases to a peak value before falling in accordance with the resonant frequency of the tank circuit 422.

Since diode D02 is connected directly to V_TANK_1, as V_TANK_1 crosses zero, as soon as DRV_2 goes low the gate of power switch QP2 discharges without additional propagation delay. This deactivates power switch QP2.

For a brief moment both power switches QP1 and QP2 are deactivated and neither side of the tank circuit is clamped to ground. Since the tank voltage is close to zero, when both V_TANK_1 and V_TANK_2 rise they are at similar voltage levels. This brings the outputs of DRV_1 and DRV_2 high simultaneously.

However, the simultaneous high level of DRV_1 and DRV_2 does not activate both QP1 and QP2 because only Q11 is active. A side effect of this circuit topology is that it prevents shoot-through of the tank current between the two output switch MOSFETs.

When DRV_1 goes high, current initially flows through D11, Q11, Rcol1, and D01 because of the near-zero voltage of V_TANK_2. As V_TANK_2 quickly rises the gate voltage of QP1 rises. The low-value resistor Rcol1 is designed to limit the current through DRV_1 during this short period of time.

Once QP1 is activated, V_TANK_1 is clamped to ground. V_TANK_2 rises and the oscillation continues.

Alternative Embodiments

Figure 5:
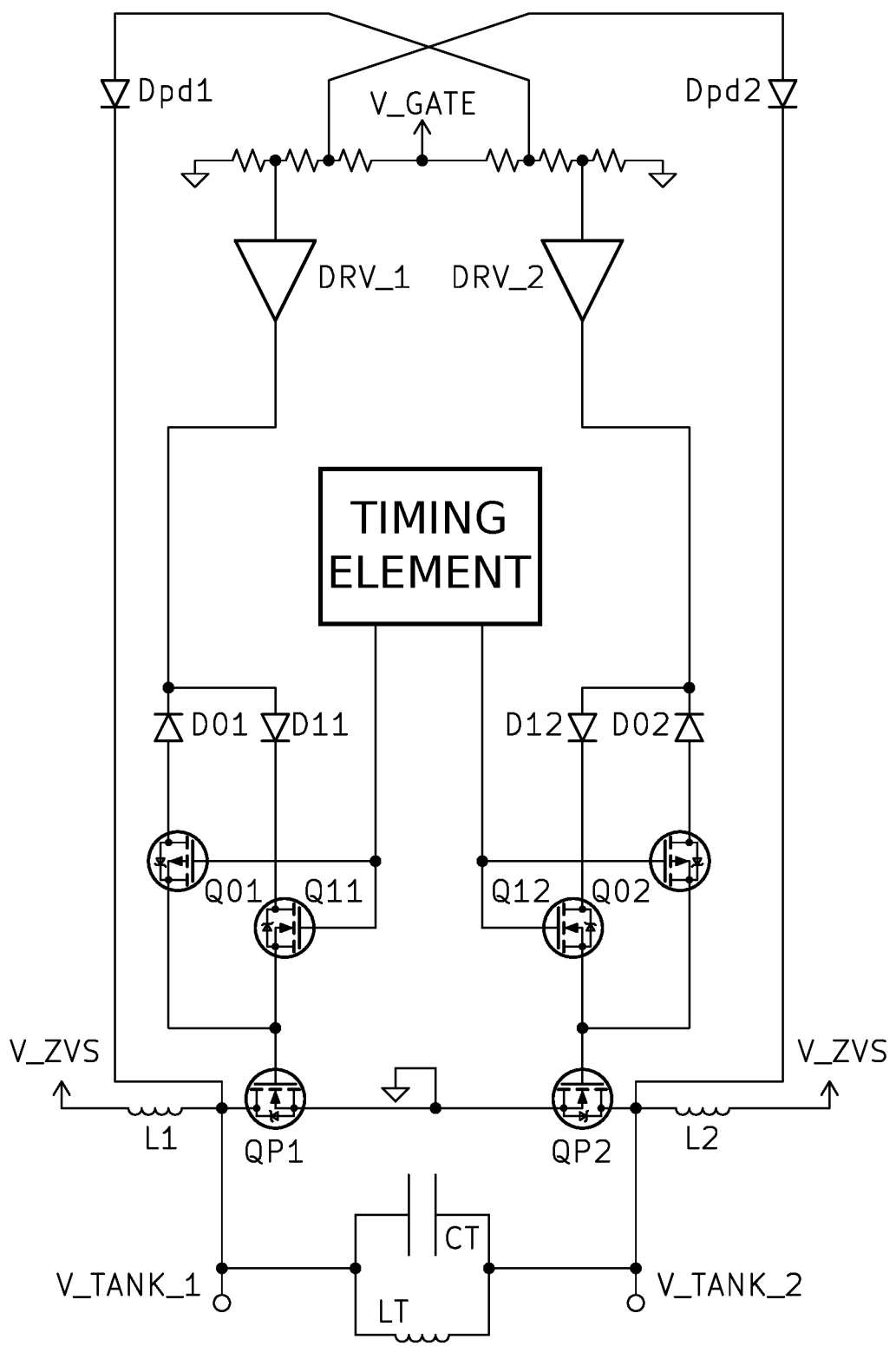
FIG. 5 is an exemplary embodiment of a circuit which protects four signal paths from parasitic oscillations.
Figure 6:
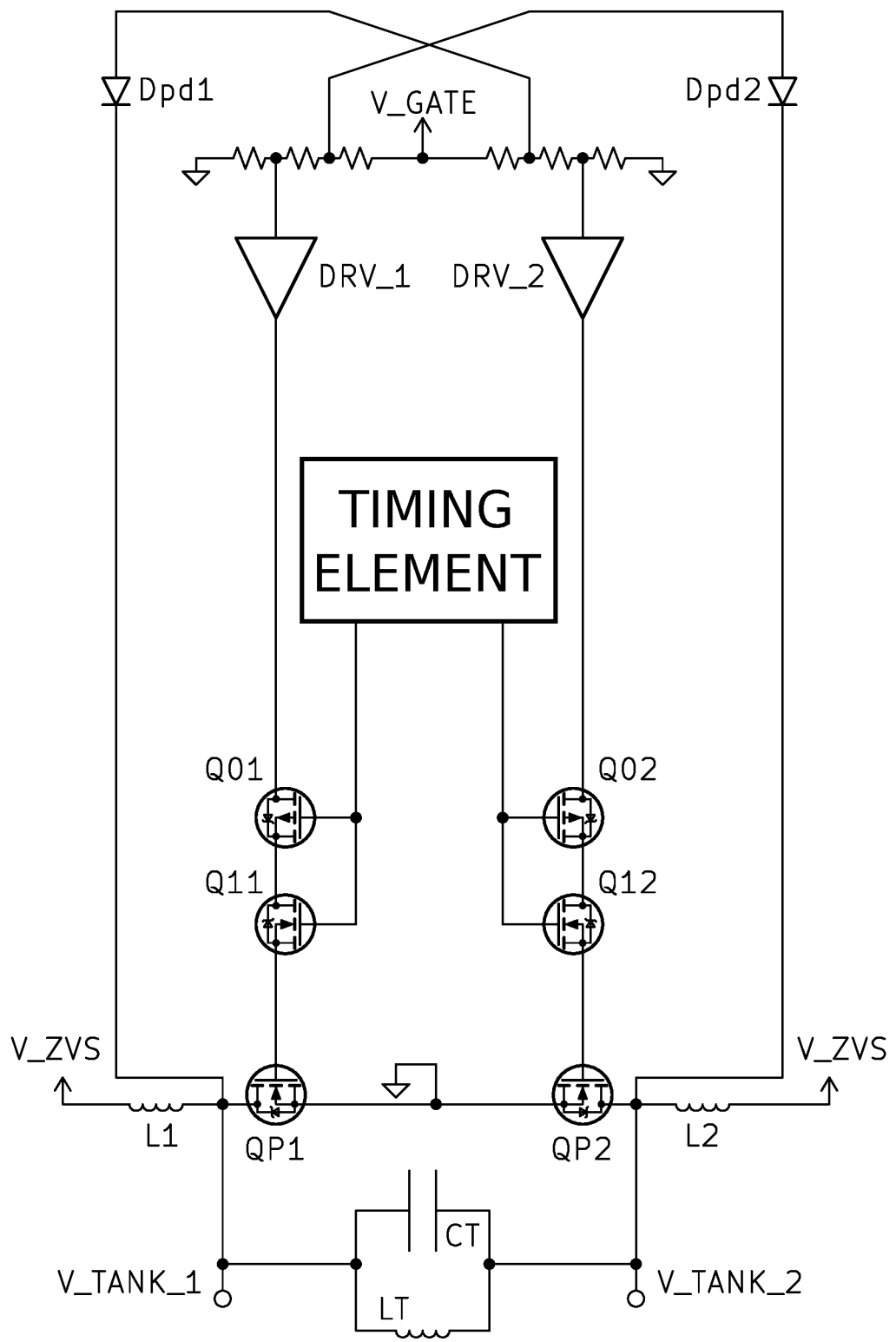
FIG. 6 is an exemplary embodiment of a circuit which combines control and directional elements to protect two multiplexed signal paths.

There are several ways to implement circuitry capable of using the methods disclosed herein. The circuit of FIG. 5 is an embodiment that contains four signal paths with a MOSFET control element and discrete directional element in each path. The circuit of FIG. 6 is an embodiment that contains multiplexed signal paths where each of the MOSFETs acts as both a control element and a directional element.

There are several signals and methods to implement a timing element, such as multivibrators, PLL circuits, microprocessors, RC delay circuits and the like. Similarly, there are several ways to sense a signal which could be used as a basis for timing, such as monitoring the voltage or current of the tank circuit, monitoring dips in the supply voltage, coupled charge or coupled flux. There may also be instances when the timing element stops switching entirely to save power. Therefore the timing element is symbolized by a functional block.

Advantages

From the aforementioned description several advantages of aspects of embodiments become apparent:
- lower cost and smaller PCB area than pulse steering circuits
- faster switching than using non-driven signals
- near zero propagation delay between ZCD and gate
- no shoot-through at zero crossings
- eliminates parasitic oscillation feedback
- single current paths reduce or eliminate gate ringing
- reduced switching losses
- improved power handling capability
- higher fundamental frequency capability
- lower EMI Conclusion, Ramifications, and Scope Embodiments of a method and means of eliminating the effects of parasitic oscillation have been disclosed. Additionally, embodiments of electrical circuit using the methods described herein have been disclosed. Implementing aspects of the disclosed embodiments may enable an oscillator to operate at lower power levels, use smaller components, and have the benefits of reduced EMI and reduced gate ringing, and may reduce circuit cost and size.

It should be understood that there are many names and definitions which can be used for common electrical components. Additionally, the concepts described herein may be applied to more than the disclosed or existing technology. Therefore the following should be considered when considering scope.

A driver may be defined as any circuit or component which determines the rate at which an output switch changes state. The drive signal may be voltage, current, light, RF, or any combination of signaling means. Other terms that might describe the function of a driver include amplifier and buffer. Drivers do not have to be discrete components but might contain multiple components. In one embodiment a driver may consist of an operational amplifier. In another embodiment a driver may use a MOSFET totem pole made with discrete components. In another embodiment a driver may be an integrated circuit which contains a Schmitt trigger.

In electronics a directional element is commonly thought of as a device which only allows current to flow in one direction. For the purposes of this disclosure the definition of a directional element may further include any component or group of components which restricts the ability of an output switch to change between two states in a specific direction. For example, changing from OFF to ON could be considered one direction and changing from ON to OFF could be considered an opposite direction. In some embodiments a directional element may be a discrete diode, a vacuum tube, or a circuit comprising multiple elements. In one embodiment a directional element may use a resistor in parallel with a diode. In another embodiment a directional element may use the p-n junction of a MOSFET.

A control element may be defined as any component or group of components that can reduce or increase the magnitude or speed of a signal in response to a signal. The signal may be electricity, light, magnetism, capacitance, RF, or any combination of signaling means. One embodiment may use a MOSFET as a control element. Another embodiment may use a BJT. Another embodiment may use an optical device such as an optocoupler. Another embodiment may use an RF device such as a digital isolator.

A timing element may be any electronic component or group of components that can generate a timing signal at some point in time. In some embodiments a timing element may generate a signal at a fixed time after a zero crossing. In other embodiments a timing element may generate a series of pulses during startup. In other embodiments a timing element may generate a signal of varying duration based on user input. In other embodiments a timing element may generate a signal of varying duration based on a signal. It should be appreciated that in some applications the need for certain aspects of the disclosure may be only temporarily needed, such as during startup. Therefore the timing element may generate signals continually, or stop generating signals after a given period of time or number of events, or under a certain condition such as the average tank voltage increasing past a threshold level.

An output switch may refer to any electronic component or group of components which connect or disconnect power to a tank circuit. An output switch has at least an ON state and an OFF state. A signal is used to change the state of the output switch. There may be a first state signal that places the output switch into an ON state and a second state signal that places the output switch into an OFF state. However, some output switches are constructed differently than others and therefore a given signal polarity may not have the same effect on two different types of switches. For example, a PMOS will respond differently than an NMOS to a signal of the same polarity. Therefore, in some embodiments a first state signal may also place an output switch into an OFF state while a second state signal may place an output switch into an ON state. One embodiment may use an IGBT connected between the tank circuit and a positive rail as an output switch. Another embodiment may use a MOSFET connected between a tank circuit and a negative rail as an output switch. Another embodiment may use multiple MOSFETs in parallel with each other as an output switch. Another embodiment may use an electronic component that does not yet exist as an output switch.

Therefore, the scope of the disclosure should be interpreted by the claims rather than by the embodiments disclosed.

What is claimed is:

1. A method for preventing a driver from changing the state of an output switch in response to parasitic oscillation, said method comprising:
   allowing a first state signal emitted by the driver to reach the output switch, wherein said first state signal causes the output switch to enter a first state;
   receiving a first timing signal, wherein the receipt of said first timing signal prevents first state signals emitted by the driver from reaching the output switch, and;
   receiving a second timing signal, wherein the receipt of said second timing signal causes said method to repeat.

2. The method of claim 1, wherein said first timing signal is generated in response to a voltage crossing a threshold level.

3. The method of claim 1, wherein a directional element prevents signals other than the first state signal from reaching the output switch.

4. The method of claim 1, wherein said first timing signal is no longer asserted after a given amount of time.

5. The method of claim 1, wherein said first timing signal is no longer asserted based on a condition.

6. A signal conveying means for conveying a plurality of signals from a driver to a output switch in a resonant oscillator, said signal conveying means comprising:
- a first timing means for generating a first timing signal, and;
- a first signal path comprising said output switch and said driver;
- wherein said first signal path further comprises a first directional means for conditionally preventing a specific signal from being conveyed based the direction of change said specific signal would cause to the output switch;
- wherein said first signal path further comprises a first control means for preventing said plurality of signals from being conveyed based on said timing signal.

7. The means of claim 6 wherein said first timing signal is generated in response to an event.

8. The means of claim 7, wherein said event comprises the voltage level of a tank circuit reaching, exceeding, or falling below a threshold level.

9. The means of claim 7, wherein said event comprises the current level of a tank circuit reaching, exceeding, or falling below a threshold level.

10. The means of claim 8, wherein said first timing means comprises a capacitive element and a resistive element.

11. The means of claim 8, wherein said first timing means comprises a phase locked loop.

12. The means of claim 8, wherein said first timing means comprises a microprocessor.

13. An oscillator circuit, said oscillator circuit comprising:
- a timing element;
- an output switch whose state is determined by the voltage level of a gate;
- a first current path containing a driver, a directional element, a control element, and said output switch;
- wherein said timing element generates a first timing signal in response to an event;
- wherein said directional element reduces the amount of current or charge which can flow along said first current path in a first direction;
- wherein said control element reduces the amount of current or charge which can flow along said first current path based upon said first timing signal.

14. The circuit of claim 13, wherein said directional element is the p-n junction of a semiconductor.

15. The circuit of claim 14, wherein said control element is a semiconductor.

16. The circuit of claim 15, wherein said timing element comprises a resistance and a capacitance.

17. The circuit of claim 15, wherein said timing element comprises a microprocessor.

18. The circuit of claim 15, wherein said event occurs when the voltage of said tank reaches or passes a threshold level.

19. The circuit of claim 15, wherein said event occurs when the current of said tank reaches or passes a threshold level.

* * * * *